United States Patent
Lee et al.

(10) Patent No.: US 8,419,466 B2
(45) Date of Patent: Apr. 16, 2013

(54) FLEXIBLE PRINTED CIRCUIT BOARD WITH SHIELDED LAYER OF DATA PINS

(75) Inventors: Chuan-Chieh Lee, New Taipei (TW); Yan-Li Guo, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/283,599

(22) Filed: Oct. 28, 2011

(65) Prior Publication Data

US 2013/0065408 A1     Mar. 14, 2013

(30) Foreign Application Priority Data

Sep. 13, 2011   (CN) .......................... 2011 2 0341025

(51) Int. Cl.
*H01R 12/24*     (2006.01)
(52) U.S. Cl.
USPC ........................................................... 439/495
(58) Field of Classification Search .................. 439/495, 439/497, 493, 92, 492; 156/247, 82, 67, 156/77; 174/74 C, 76, 36
See application file for complete search history.

(56) References Cited

U.S. PATENT DOCUMENTS

| | | | |
|---|---|---|---|
| 4,211,459 A * | 7/1980 | Madden | 439/325 |
| 4,252,389 A * | 2/1981 | Olsson | 439/65 |
| 4,269,462 A * | 5/1981 | Bethurum | 439/269.1 |
| 4,279,459 A * | 7/1981 | Sherman | 439/325 |
| 4,295,696 A * | 10/1981 | Gray | 439/55 |
| 4,329,008 A * | 5/1982 | Braginetz | 439/80 |
| 4,417,776 A * | 11/1983 | Motoyama | 439/76.1 |
| 4,420,203 A * | 12/1983 | Aug et al. | 439/71 |
| 4,420,206 A * | 12/1983 | Martyniak | 439/368 |
| 4,423,466 A * | 12/1983 | Beun | 361/760 |
| 4,509,097 A * | 4/1985 | Robinson | 361/740 |
| 4,938,701 A * | 7/1990 | Heberling | 439/65 |
| 5,022,862 A * | 6/1991 | Martin et al. | 439/83 |
| 5,199,896 A * | 4/1993 | Mosquera | 439/329 |
| D349,099 S * | 7/1994 | Robertson et al. | D13/147 |
| 5,674,077 A * | 10/1997 | Flaig et al. | 439/63 |
| 5,676,562 A * | 10/1997 | Fukuda | 439/329 |
| 5,813,876 A * | 9/1998 | Rutigliano | 439/260 |
| 5,876,216 A * | 3/1999 | Schadewald et al. | 439/67 |
| 6,071,137 A * | 6/2000 | Rutigliano | 439/197 |
| 6,150,813 A * | 11/2000 | Schadewald et al. | 324/262 |
| 6,299,473 B1 * | 10/2001 | Schwarz et al. | 439/404 |
| D479,507 S * | 9/2003 | Shimirak et al. | D13/133 |
| 7,059,884 B2 * | 6/2006 | Hisaeda et al. | 439/329 |
| 7,066,756 B2 * | 6/2006 | Lange et al. | 439/329 |

* cited by examiner

*Primary Examiner* — Alexander Gilman
(74) *Attorney, Agent, or Firm* — Altis Law Group, Inc.

(57) ABSTRACT

An exemplary flexible printed circuit board (FPCB) includes a flexible printed circuit (FPC) body and a connector. The FPC body includes two ground layers and a signal layer sandwiched between and shielded by the two ground layers. The connector includes two layers of ground pins and a layer of data pins sandwiched between the two layers of ground pins. The layer of data pins are electrically connected to the signal layer, and the two layers of ground pins are electrically connected to the two ground layers, respectively.

11 Claims, 3 Drawing Sheets

FLEXIBLE PRINTED CIRCUIT BOARD WITH SHIELDED LAYER OF DATA PINS

BACKGROUND

1. Technical Field

The present disclosure generally relates to flexible printed circuit boards (FPCBs), and more particularly to a connector of an FPCB configured for providing unimpaired and safe signal transmission.

2. Description of Related Art

Many modern electronic devices employ flexible printed circuit boards (FPCBs). An FPCB comprises a plurality of data pins for electrically connecting with connectors positioned on other printed circuit boards (PCBs) and thereby providing signal transmission between the FPCB and the PCBs. Generally, even when the data pins are connected with the connectors, at least portions of the data pins remain exposed to the environment. Therefore the signal transmission between the FPCB and the PCBs is very susceptible to degradation by electromagnetic interference (EMI), and the data pins are at risk of conducting electrostatic discharge (ESD).

Therefore, a need exists in the industry to overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the views.

DETAILED DESCRIPTION

Figure 1:
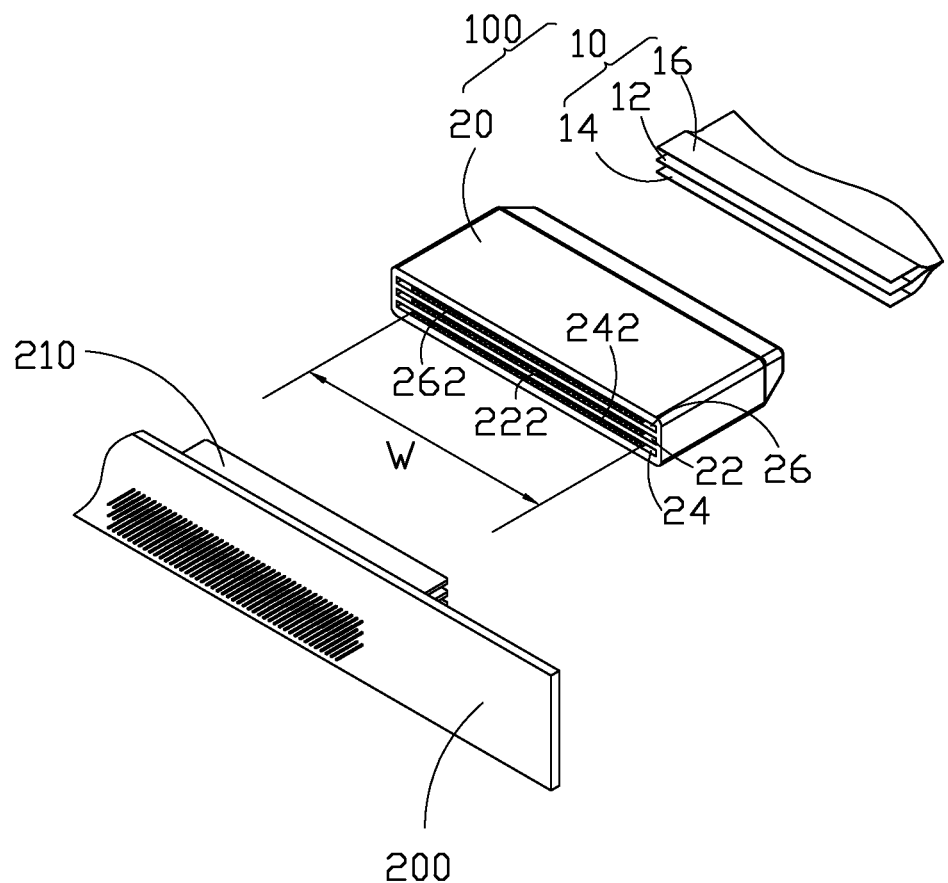
FIG. 1 is an exploded perspective view of a flexible printed circuit board (FPCB) of an exemplary embodiment of the disclosure, together with a main board.

The embodiments described herein are illustrated by way of example and not by way of limitation in the figures of the accompanying drawings, in which like reference numerals indicate the same or similar elements. It should be noted that references to "an" or "one" embodiment in this disclosure are not necessarily to the same embodiment, and such references can mean "at least one."

Figure 2:
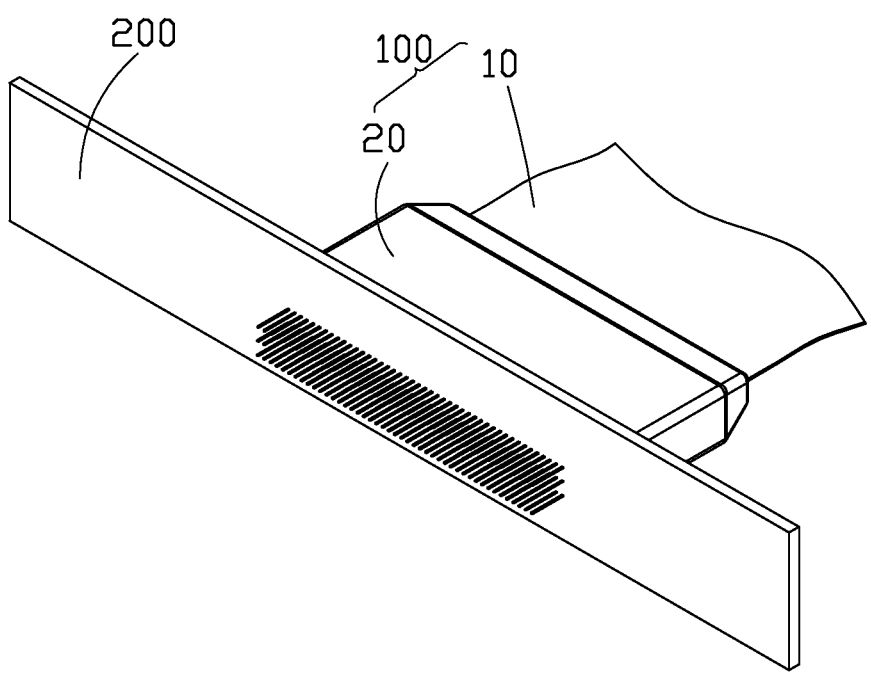
FIG. 2 is an assembled view of the FPCB and the main board of FIG. 1.
Figure 3:
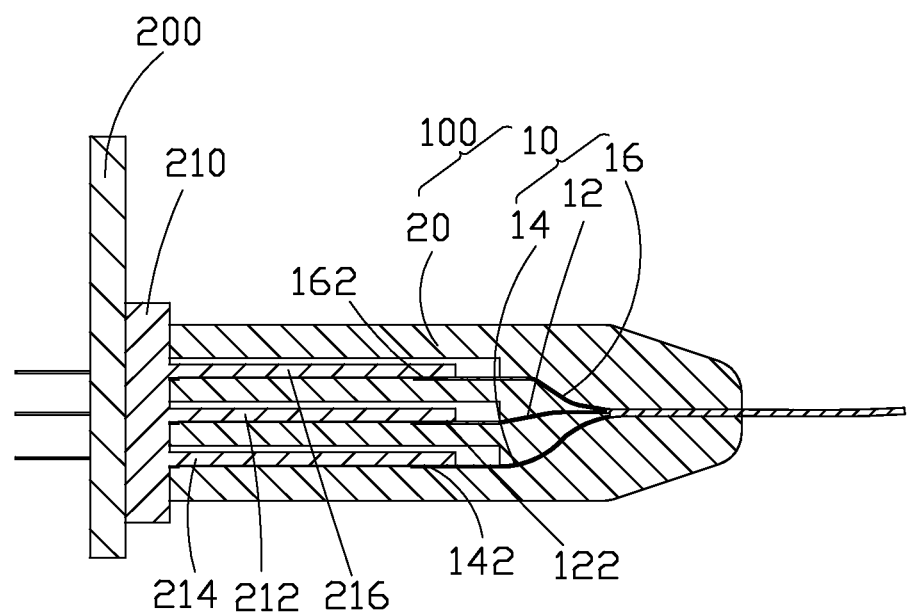
FIG. 3 is a cross-sectional view of the FPCB and the main board of FIG. 2.

Referring to FIGS. 1-3, a flexible printed circuit board (FPCB) 100 of an exemplary embodiment of the disclosure is used to electrically connect with a main board 200 of an electronic device to transmit signals between the FPCB 100 and the main board 200. The FPCB 100 comprises a flexible printed circuit (FPC) body 10, and a female connector 20 attached to an end of the FPC body 10. The main board 200 comprises a male connector 210 used to match with the female connector 20 of the FPCB 100 to achieve the signal transmission.

The FPC body 10 comprises two ground layers 14, 16, and at least one signal layer 12 sandwiched between and shielded by the two ground layers 14, 16. The female connector 20 comprises two layers of ground pins 242, 262 and at least one layer of data pins 222 sandwiched between and shielded by the two layers of ground pins 242, 262. In this embodiment, the female connector 20 defines a first slot 22 used to receive the at least one layer of data pins 222, a second slot 24 used to receive the layer of ground pins 242, and a third slot 26 used to receive the layer of ground pins 262. The first, second and third slots 22, 24, 26 can be considered to be stacked one on the other, and are parallel with each other. In this embodiment, a width W of the least one layer of data pins 222 is equal to that of each of the two layers of ground pins 242, 262. In other embodiments, the width of the least one layer of data pins 222 is less than that of each of the two layers of ground pins 242, 262.

The at least one layer of data pins 222 are electrically connected to the at least one signal layer 12, and the two layers of ground pins 242, 262 are respectively electrically connected to the corresponding ground layers 14, 16. In this embodiment, the at least one signal layer 12 extends into the first slot 22 to electrically connect to the at least one layer of data pins 22, and the ground layers 14, 16 respectively extend into the second and third slots 24, 26 to electrically connect to the ground pins 242, 262, respectively. In particular, the two ground layers 14, 16 and the signal layer 12 of the FPC body 10 each comprise one terminal portion 142, 162, 122, respectively. The three terminal portions 142, 162, 122 are spaced from each other. The layer of data pins 222 are electrically connected to the terminal portion 122 of the signal layer 12, and the two layers of ground pins 242, 262 are electrically connected to the terminal portions 142, 162 of the two ground layers 14, 16, respectively.

The male connector 210 of the main board 200 comprises a signal terminal portion 212 inserted into the first slot 22 to electrically connect to the at least one layer of data pins 222, and two ground terminal portions 214, 216 respectively located at two sides of the signal terminal portion 212 and inserted into the second and third slots 24, 26 to electrically connect to the ground pins 242, 262, respectively. That is, the signal terminal portion 212 is sandwiched between and shielded by the two ground terminal portions 214, 216.

The at least one layer of data pins 222 of the female connector 20 is sandwiched and shielded between the two layers of ground pins 242, 262 for unimpaired and safe signal transmission. In particular, the signal transmission in the at least one layer of data pins 222 is not very susceptible to degradation by electromagnetic interference (EMI), and the at least one layer of data pins 222 are at minimal risk of conducting electrostatic discharge (ESD). This helps ensure good signal integrity and quality and secure operation of the FPCB 100 and the electronic device.

Although features and elements of the present embodiments are described in particular combinations, each feature or element can be used alone or in other various combinations within the principles of the present disclosure to the full extent indicated by the broad general meaning of the terms in which the appended claims are expressed.

What is claimed is:

1. A flexible printed circuit board (FPCB), comprising:
   a flexible printed circuit (FPC) body, comprising two ground layers and at least one signal layer sandwiched between and shielded by the two ground layers; and
   a female connector attached to the FPC body, the female connector comprising:
   two layers of ground pins;
   at least one layer of data pins sandwiched between the two layers of ground pins;
   a first slot receiving the at least one layer of data pins;

a second slot receiving one of the layers of ground pins; and a third slot receiving the other layer of ground pins;

wherein the at least one layer of data pins are electrically connected to the at least one signal layer, and the two layers of ground pins are electrically connected to the two ground layers, respectively.

2. The FPCB of claim 1, wherein the first, second and third slots are stacked one on the other, and are parallel with each other.

3. The FPCB of claim 1, wherein the at least one signal layer extends into the first slot and electrically connects with the at least one layer of data pins, and the ground layers respectively extend into the second and third slots and electrically connect with the ground pins.

4. The FPCB of claim 1, wherein a width of the least one layer of data pins is substantially equal to that of each of the two layers of ground pins.

5. The FPCB of claim 1, wherein a width of the least one layer of data pins is less than that of each of the two layers of ground pins.

6. A flexible printed circuit board (FPCB), comprising:
a flexible printed circuit (FPC) body, comprising two ground layers and a signal layer sandwiched between and shielded by the two ground layers; and
a female connector attached to an end of the FPC body and adapted to be connected to a mating male connector, the female connector comprising;
two layers of ground pins;
a layer of data pins sandwiched between the two layers of ground pins;
a first slot receiving the at least one layer of data pins;
a second slot receiving one of the layers of the ground pins; and
a third slot receiving the other layer of the ground pins;

wherein the layer of data pins are electrically connected to the signal layer, and the two layers of ground pins are electrically connected with the two ground layers, respectively.

7. The FPCB of claim 6, wherein each of the two ground layers and the signal layer of the FPC body comprises a terminal portion, the three terminal portions are spaced from each other, the layer of data pins are electrically connected to the terminal portion of the signal layer, and the two layers of ground pins are electrically connected to the terminal portions of the two ground layers, respectively.

8. The FPCB of claim 6, wherein the first, second and third slots are stacked one on the other, and are in parallel with each other.

9. The FPCB of claim 6, wherein the at least one signal layer extends into the first slot and electrically connects to the at least one layer of data pins, and the ground layers respectively extend into the second and third slots and electrically connect to the ground pins.

10. The FPCB of claim 6, wherein a width of the least one layer of data pins is substantially equal to that of each of the two layers of ground pins.

11. The FPCB of claim 6, wherein a width of the least one layer of data pins is less than that of each of the two layers of ground pins.

* * * * *